United States Patent
Aoki et al.

(10) Patent No.: US 10,497,687 B2
(45) Date of Patent: Dec. 3, 2019

(54) CONFIGURABLE SEMICONDUCTOR PACKAGE

(71) Applicant: Intel Corporation, Santa Clara, CA (US)

(72) Inventors: Russell S. Aoki, Tacoma, WA (US); Casey G. Thielen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 398 days.

(21) Appl. No.: 15/396,434

(22) Filed: Dec. 31, 2016

(65) Prior Publication Data

US 2018/0190634 A1   Jul. 5, 2018

(51) Int. Cl.
*H01L 21/50* (2006.01)
*H01L 25/18* (2006.01)
(Continued)

(52) U.S. Cl.
CPC .............. *H01L 25/18* (2013.01); *H01L 23/32* (2013.01); *H01L 23/544* (2013.01);
(Continued)

(58) Field of Classification Search
CPC ....... H01L 23/32; H01L 23/544; H01L 25/50; H01L 25/0655; H01L 25/18; H05K 3/341; H05K 3/3494
(Continued)

(56) References Cited

U.S. PATENT DOCUMENTS 9,786,623 B2 * 10/2017 Lin ..................... H01L 21/561
9,847,271 B2 * 12/2017 Miura ................. H01L 23/3128
(Continued)

FOREIGN PATENT DOCUMENTS

KR   2016-0079644 A   7/2016
WO   2012/108944 A2   8/2012

OTHER PUBLICATIONS

International Search Report and Written Opinion of PCT/US2017/062875, dated Mar. 30, 2018 (17 pages).

*Primary Examiner* — Luan C Thai
(74) *Attorney, Agent, or Firm* — Eversheds Sutherland (US) LLP

(57) ABSTRACT

Configurable semiconductor packages and processes to attain a defined configuration are provided. A configurable semiconductor package includes a base semiconductor package including a semiconductor die mounted on a surface of a package substrate. An expansion package can be mechanically coupled to a mounting member. The expansion package includes a second package substrate and one or more second semiconductor dies that can be surface mounted to the second package substrate. The second package substrate include an array of interconnects that permit coupling (mechanically and/or electrically) the second semiconductor die(s) to the package substrate of the base semiconductor package. The mounting member can mechanically attach to the base semiconductor package, resulting in a package assembly that has the array of interconnects adjacent to another array of interconnects in the package substrate of the base semiconductor package. The expansion package can be coupled to the base semiconductor package via the interconnects, providing expanded functionality relative to the functionality of the base semiconductor package.

20 Claims, 12 Drawing Sheets

(51) Int. Cl.
*H01L 23/544* (2006.01)
*H05K 1/18* (2006.01)
*H05K 3/34* (2006.01)
*H01L 25/065* (2006.01)
*H01L 25/00* (2006.01)
*H01L 23/32* (2006.01)

(52) U.S. Cl.
CPC .......... *H01L 25/0655* (2013.01); *H01L 25/50* (2013.01); *H05K 1/181* (2013.01); *H05K 3/341* (2013.01); *H05K 3/3494* (2013.01); *H01L 2223/54426* (2013.01); *H05K 2201/10378* (2013.01); *H05K 2201/10522* (2013.01); *H05K 2201/10734* (2013.01); *H05K 2203/11* (2013.01)

(58) Field of Classification Search
USPC ........................................................ 438/107
See application file for complete search history.

(56) References Cited

U.S. PATENT DOCUMENTS

| | | |
|---|---|---|
| 2011/0253428 A1 | 10/2011 | Lim et al. |
| 2014/0162473 A1 | 6/2014 | Aoki et al. |
| 2014/0225284 A1 | 8/2014 | Thacker et al. |
| 2015/0115424 A1 | 4/2015 | Riviere et al. |
| 2016/0293802 A1 | 10/2016 | Lin |

* cited by examiner

CONFIGURABLE SEMICONDUCTOR PACKAGE

BACKGROUND

The architecture of a computing device package typically increases in complexity as functional elements and capabilities are added from a current generation to a new generation. Changes in architectural complexity also are generally accompanied by proliferation in the number of designs of the computing device package that can achieve a desired set of functional elements and/or capabilities. Accommodating changes in architectural complexity and proliferation of designs can result in complex packages that can incorporate a wide range of functional features. Such features can be overly encompassing, including various types of capabilities that may pertain to different functionality spaces intended by different entities that utilize a computing device package. Therefore, much remains to be improved in the design of semiconductor packages having intended functionality.

BRIEF DESCRIPTION OF THE DRAWINGS

The accompanying drawings are an integral part of the disclosure and are incorporated into the subject specification. The drawings illustrate example embodiments of the disclosure and, in conjunction with the description and claims, serve to explain at least in part various principles, features, or aspects of the disclosure. Certain embodiments of the disclosure are described more fully below with reference to the accompanying drawings. However, various aspects of the disclosure can be implemented in many different forms and should not be construed as limited to the implementations set forth herein. Like numbers refer to like, but not necessarily the same or identical, elements throughout.

DETAILED DESCRIPTION

Figure 1:
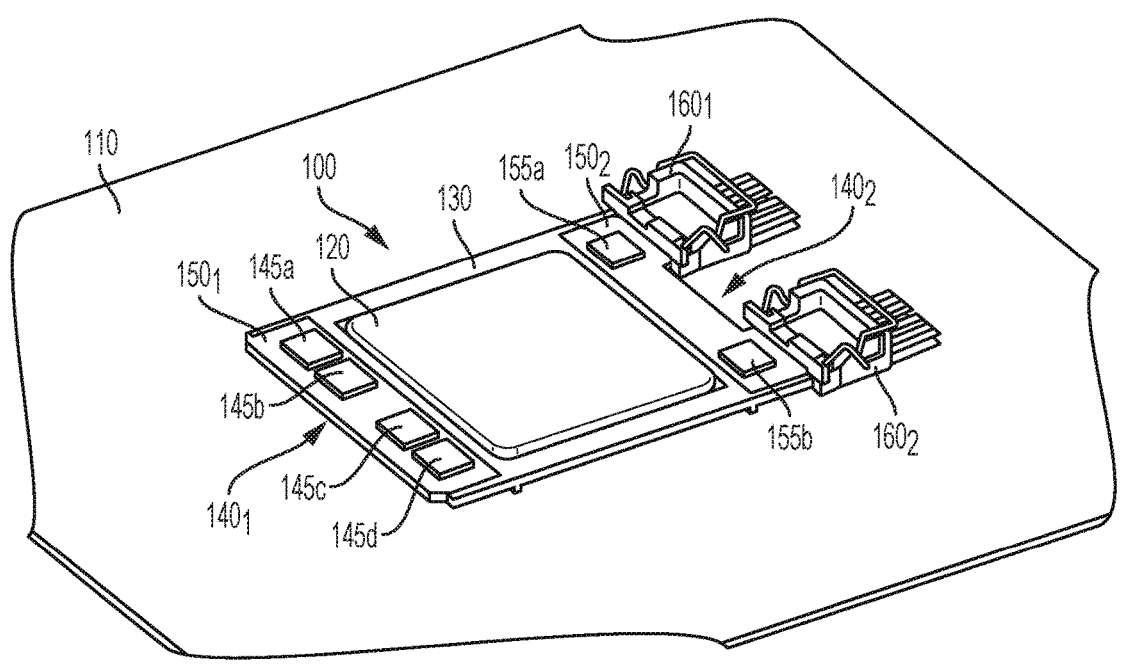
FIG. 1 presents a schematic perspective top-view of an example of a configurable semiconductor package in accordance with one or more embodiments of the disclosure.

The disclosure recognizes and addresses, in at least some embodiments, the issue of increased architectural complexity of computing device packages in transitions from a current device generation to a new generation. Such an issue usually can reveal itself in the design and fabrication of customized solutions including specific package designs and stock keeping units (SKUs) that satisfy a set of functionality requirements, thus resulting in SKU proliferation as the number of customized solutions increases in order to satisfy different sets of functionality requirements. The issue can further reveal itself in the reliance on the design and fabrication of a nominally universal package that is intended to satisfy a superset of product requirements. Therefore, embodiments of the disclosure provide configurable semiconductor packages and processes to attain a defined configuration. At least some embodiments can permit a base semiconductor package to adapt to an intended or otherwise satisfactory feature set. A configurable semiconductor package includes a base semiconductor package including a semiconductor die mounted on a surface of a package substrate. The semiconductor die can provide one or more functionalities that embody a base feature set. In addition, the configurable semiconductor package can include an expansion package that can be mechanically movably coupled to a mounting member. The expansion package includes a second package substrate and one or more second semiconductor dies that provide respective one or more functionalities. The respective one or more functionalities can embody, collectively, an add-on feature set associated with the expansion package. Each of the one or more semiconductor packages can be surface mounted, via one or more first interconnects, to a first surface of the second package substrate. In addition, the second package substrate can include an array of second interconnects at a second surface of the second package, the second surface opposite the first surface. The array of interconnects can permit or otherwise facilitate coupling (mechanically and/or electrically) the second package substrate to the package substrate of the base semiconductor package. The mounting member having the expansion package coupled thereto can mechanically attach to the base semiconductor package, resulting in a package assembly including the base semiconductor package and the expansion package. In some embodiments, the package assembly can have the array of second interconnects of the second semiconductor package positioned adjacently to a second array of third interconnects in the package substrate of the base semiconductor package. As such, in one example, the array of second interconnects and the second array of third interconnects can be proximate to one another and placed at respective locations along a direction perpendicular to the package substrate. In some embodiments, the array of second interconnects can be embodied in or can include a ball grid array (BGA), and the second array of third interconnects can be embodied in or can include multiple conductive pads in a defined layout. The expansion package can be coupled to the base semiconductor package via the array of second interconnects and the second array of third interconnects, thus combining the add-one feature set and the base feature set to provide expanded functionality to the base semiconductor package. The addition of one or more expansion packages as disclosed herein can permit or otherwise facilitate the customization of an intended product feature set based at least on one or more customization criteria for a product that includes one or more configurable semiconductor packages in accordance with one or more embodiments of the disclosure.

The various concepts disclosed herein can be applied to add a number N (a natural number) of expansion packages to a base semiconductor package. While embodiments of the disclosure are illustrated with reference to N=1 or N=2, the disclosure is not limited in that respect and configurations with N≥3 also can be implemented.

Embodiments of the disclosure can provide several advantages compared to conventional solutions that rely on the fabrication of dedicated device packages that have a design customized to a current set of functional elements and/or a universal package that meets a superset of customer product requirements. In one example advantage, some embodiments of the disclosure can constrain the usage of expensive high density substrate to a minimum in-plane (under the main silicon; perpendicular to a stacking direction) span, incorporating expansion packages having less expensive respective substrates (such as PCB or the like). In another example advantage, at least some embodiments of the disclosure can permit or otherwise facilitate managing an abridged SKU set that increases controllably, as opposed to a proliferating set of SKUs, as it would be the case in conventional technology. Reliance of an abridged SKU set associated with base packages having respective minimum feature sets, can permit the addition of SKUs associated with expansion packages, which can be less complex and yet provide an intended set of functionalities in combination with a base package. In another example advantage, some embodiments of the disclosure can provide flexibility by permitting a customer to generate SKUs of their product at the time of SMT. To that end, when the customer mounts or otherwise couples a configurable semiconductor package on the product board, a defined configuration can be configured by placing one or more expansion packages on the package substrate. Such flexibility being absent in conventional technology which relies on acquiring project different CPU SKUs prior to utilization of a desired functionality.

With reference to the drawings, FIG. 1 illustrates an example of a semiconductor package 100 in accordance with one or more embodiments of the disclosure. The semiconductor package 100 can be surface mounted to a product board 110 (e.g., a motherboard, a printed circuit board (PCB), or the like). The semiconductor package 100 also includes a semiconductor die 120 that can be mounted or otherwise coupled to a package substrate (not depicted in FIG. 1; see package substrate 230 in FIG. 2). The semiconductor die 120 includes circuitry that can provide one or more functionalities (e.g., computing, navigation, sensing, a combination thereof, or the like). The one or more functionalities can embody or can constitute, in some aspects, a defined set of features. In some embodiments, the circuitry can embody or can include microprocessors, microcontrollers, application specific integrated circuits (ASICs), gate arrays, memory devices, digital signal processors (DSPs), programmable logic devices (PLDs), graphics chipsets and/or PC chipsets, a combination of the foregoing, or the like. In addition or in some embodiments, the semiconductor die 120 also can include a microelectromechanical system (MEMS)—such as a movable diaphragm and a backplate in a microphone, a gyroscope or another type of solid-state accelerometer, channels for microfluidics, a combination of the foregoing, or the like—that also can permit or otherwise facilitate, at least partially, at least one of the one or more functionalities.

In some embodiments, to mount or otherwise couple the semiconductor die 120 to the package substrate, multiple interconnects can be arranged on a substantially planar substrate layer of the package substrate. The substantially planar substrate layer is adjacent to a surface of the semiconductor die 120. The surface can include multiple conductive chip pads (e.g., metal pads or metallic pads) mechanically and/or electrically coupled to respective ones of the multiple interconnects on the package substrate. The multiple interconnects can be embodied in or can include, for example a BGA. Thus, in some embodiments, each of the multiple interconnects can be embodied in a solder ball in contact with a portion of the substantially planar substrate. As such, the multiple interconnects can be embodied in solder balls assembled in respective positions within a grid having a defined pitch (or lattice constant). The grid can correspond to a finite square point lattice, a finite triangular lattice, a finite hexagonal lattice, or the like. The pitch and/or the number of solder balls in the BGA can be specific to the semiconductor die 120. In one example the pitch can be about 1.00 mm. In another example, the pitch can be about 1.27 mm. The number of solder balls (or ball count) can correspond to number of leads in the semiconductor die 120. In some embodiments, the number of solder balls can range from about 196 to about 615. Examples of ball count include about 196, about 208, about 241, about 256, about 304, about 324, about 352, about 421, about 432, about 468, about 492, about 540, about 544, and about 615. The solder balls can have substantially the same diameter (e.g., diameter variations from solder ball to solder ball can be about the spatial resolution of the technique utilized to form the solder balls). Example diameters can include a first diameter having a magnitude of about 100 μm, a second diameter having a magnitude of about 400 μm, a third diameter having a magnitude of about 600 μm, and a fourth diameter having a magnitude of about 900 μm. It is noted that, within the semiconductor package 120, the diameter of a solder ball can correspond to the diameter of a cross-section of the ball at a mid-section plane parallel to the planar substrate layer. In the direction normal to the planar substrate layer, the height of a solder ball can be referred to as package standoff corresponding to the separation between the package substrate and the board substrate 110. In some examples, for the sake of nomenclature, the packages standoff can be labeled as $A_1$ (a real number) and can range from about 300 μm to about 700 μm (e.g., about 300 μm, about 400 μm, about 500 μm, about 560 μm, and about 700 μm). Each of the solder balls in the BGA can be an electric and/or thermal conductor, and can be formed from or can include a lead-tin alloy or a lead-free eutectic alloy. Examples of the lead-tin alloy include a eutectic mixture of about 50% Sn and about 50% Pb, and another eutectic mixture of about 63% Sn and about 37% Pb. Examples of the lead-free alloy can include a gold-tin alloy, a gold-silicon alloy, a tin-silver alloy, or a tin-silver-copper alloy (referred to as SAC), The semiconductor package 100 includes a mounting member 130 that can permit or otherwise facilitate configuring the semiconductor package 100 with multiple expansion packages, including an expansion package 140$_1$ and an expansion package 140$_2$. Each expansion package of the multiple expansion packages can include a semiconductor die that can be surface mounted to a substrate including interconnects (such as a BGA; not depicted in FIG. 1) that permit or otherwise facilitate coupling the expansion package to the package substrate 110. The addition of one or more expansion packages can permit the customization of a product that includes the semiconductor die 120 and the one or more expansion packages. Specifically, the addition of an expansion package can increase the scope of functionality of the product by introducing new functionality and/or enhancing functionality already present in the semiconductor die 120. In an example scenario in which the semiconductor die 120 provides computing functionality, introducing new functionality via an expansion package can include adding storage functionality. In another example, enhancing functionality via the expansion package can include adding computing functionality to the semiconductor die 120 that already provides computing functionality. Specifically, a semiconductor die included in the expansion package can embody or can include a processor core that can be added to other processor core(s) that can be present in the semiconductor package 100. The expansion package(s) can be coupled to the package substrate in response to (e.g., upon or after) mounting or otherwise coupling the package substrate to the product board 110. As mentioned, numerous techniques from surface mounting technology can be utilized or otherwise leveraged to mount the package substrate to the product board 110.

In addition, at least one of the multiple expansion packages can be coupled to a group of connectors, including a first connector 160$_1$ and a second connector 160$_2$. The group of connectors can permit or otherwise facilitate the electrical and/or mechanical coupling between interconnects in an expansion member and external functional elements (e.g., a power distribution network, capacitor(s), other semiconductor die(s), and the like) that may be present in the product board 110. Specifically, in some embodiments, the mounting member 130 can be configured to receive the expansion package 140$_1$ and the expansion package 140$_2$. As illustrated, in one embodiment, the expansion package 140$_1$ can include a semiconductor die 145*a*, a semiconductor die 145*b*, a semiconductor die 145*c*, and a semiconductor die 145*d*, each of which dies can be surface mounted to a package substrate 150$_1$. In addition, the expansion package 140$_2$ can include a semiconductor die 155*a* and a semiconductor die 155*b*, each surface mounted to a package substrate 150$_2$.

The mounting member 130 can be formed from or can include a metal, a metal alloy, a plastic material, a composite material, a combination thereof, or the like. In one embodiment, the mounting member 130 can be formed as a single part that can be machined, 3D printed, or injection molded according to aspects described herein. In another embodiment, the mounting member 130 can be assembled from different parts, which can be extruded, machined, 3D printed, injection molded, or a combination thereof.

Figure 2:
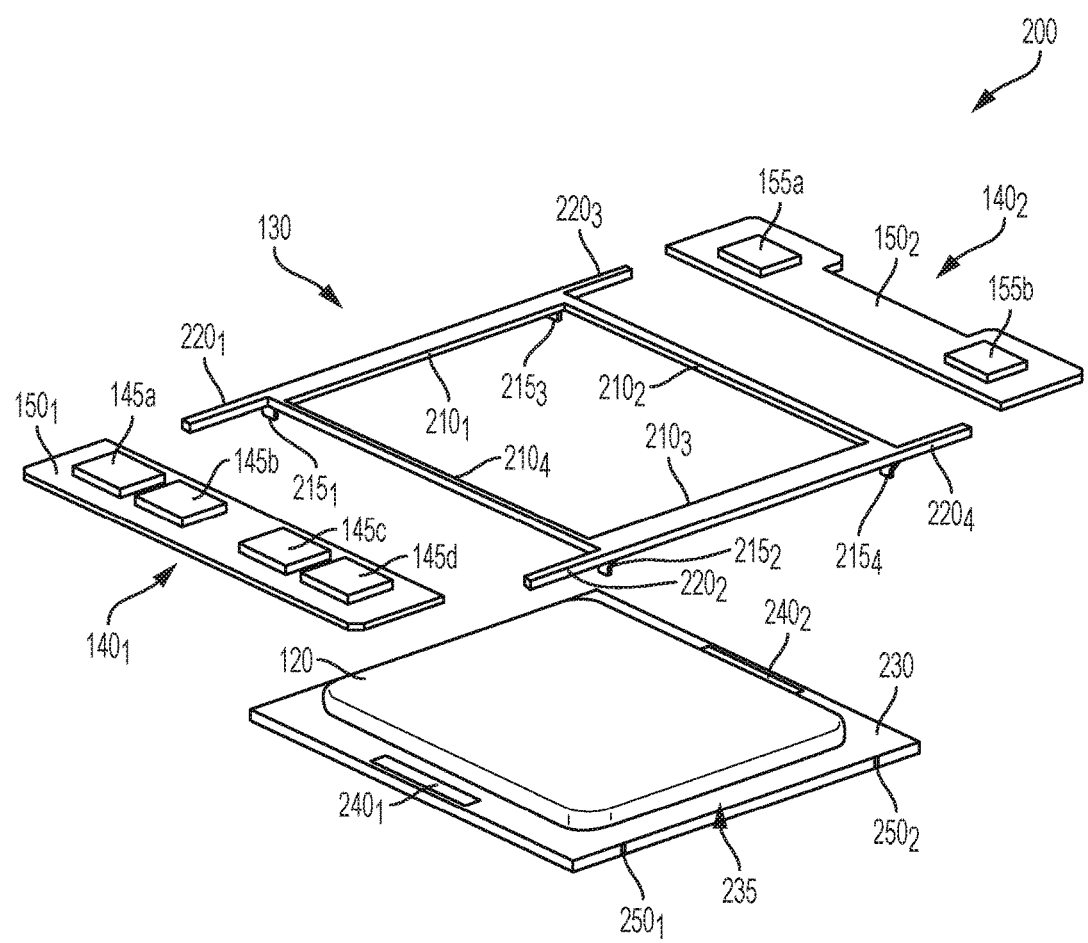
FIG. 2 presents a schematic perspective top-view of a deconstructed assembly of the example semiconductor package shown in FIG. 1.

In some embodiments, the mounting member 130 can include a frame that can enclose the semiconductor die 120. The frame can include a group of edges that define a perimeter of the frame. Each edge of the group of edges can include a recess that can extend along a longitudinal access of the edge from a first end of the edge to a distal second end of the edge. The recess can include a sidewall and a top wall that is perpendicular to the sidewall and adjoins the side wall. In addition, the mounting member 130 can include a group of coupling members, each configured to receive a portion of a substrate of an attachment member included in the semiconductor package 100. More specifically, as illustrated in FIG. 2, the group of edges can include a first edge 210$_1$, a second edge 210$_2$, and third edge 210$_3$, and a fourth edge 210$_4$. In addition, the group of coupling members can include a first coupling member 220$_1$, a second coupling member 220$_2$, a third coupling member 220$_3$, and a fourth coupling member 220$_4$. Each of the coupling member 220$_1$ and the coupling member 220$_2$ can receive respective portions of the package substrate 150$_1$. In addition, each of the coupling member 220$_3$ and the coupling member 220$_4$ can receive respective portions of the package substrate 150$_2$. Further, the frame 130 also can include a group of alignment members (e.g., protrusion(s), slab(s), or the like), including a first alignment member 215$_1$, a second alignment 215$_2$, a third alignment member 215$_3$, and a fourth alignment member 215$_4$.

Figure 3:
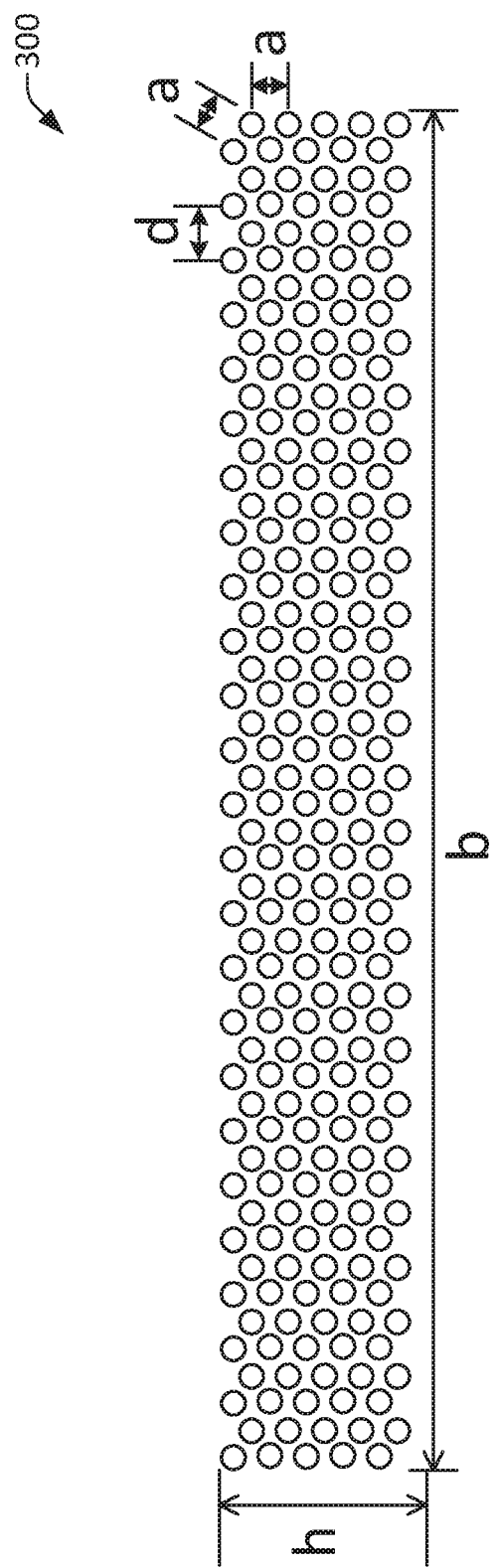
FIG. 3 presents a schematic example of an array of interconnects that can be utilized in a configurable semiconductor package, in accordance with one or more embodiments of the disclosure.

The semiconductor die 120 can be surface mounted to a package substrate 230, as is illustrated in FIG. 2. The package substrate 230 can include a first substrate layer 235 to which the semiconductor die 120 can be mounted or otherwise coupled. In addition, the package substrate can include a group of indentations to receive respective ones of the group of alignment members in the frame 130. The group of indentations can be placed or otherwise formed on side surfaces of the semiconductor package 230, and can include a first indentation 250$_1$ and a second indentation 250$_2$. The first substrate layer 235 is opposite to a second substrate layer of the semiconductor package. In addition, the first substrate layer 235 can include a group of interconnect arrays, including a first interconnect array 240$_1$ and a second interconnect array 240$_2$. Each one of the group of interconnect arrays can span a respective one of a group of surfaces. In addition, in some embodiments, each one (or, in some embodiments, at least one) of the interconnect array 240$_1$ and the interconnect array 240$_2$ can span, for example, a substantially rectangular area having a first side length in a range from about 1.0 mm to about 100 mm and a second side length in a range from about 1.0 mm to about 5.0 mm. In addition, each of (or, in some embodiments, at least one) of the interconnect array 240$_1$ and the interconnect array 240$_2$ can be embodied in or can include multiple conductive pads (e.g., metal pads or metallic pads) arranged in a defined layout, such as a fragment of a periodic two-dimensional lattice (e.g., a square lattice, a face-centered square lattice, a triangular lattice, a hexagonal lattice, or the like). In one example, the fragment of the periodic two-dimensional lattice is embodied in or includes a finite hexagonal lattice having a defined pitch (or lattice constant) of a magnitude within a range from about 200 µm to about 1000 µm. In addition, a number of the solder balls arranged in such a fragment can range from about 25 to about 2000. In one example, the number of the solder ball can be about 150 conductive pads, where about 130 conductive pads can be utilized as input/output (I/O) interconnects and about 20 conductive pads can be utilized as power interconnects. As an illustration, FIG. 3 presents an example of an array of conductive pads 300 that can embody or can constitute one or more of the interconnect array 240$_1$ or the interconnect array 240$_2$. The array of conductive pads 300 can have a first side length b in a range from about 1.0 mm to about 100 mm, and a second side length h in a range from about 1.0 mm to about 5.0 mm. In addition, the array of conductive pads 300 can be embodied in a finite hexagonal lattice having a defined pitch a within a range from about 200 µm to about 1000 µm. In one example, b can be about 30 mm, h can be about 4.75 mm, a can be about 700 and d can be about 1.212 mm.

Figure 4:
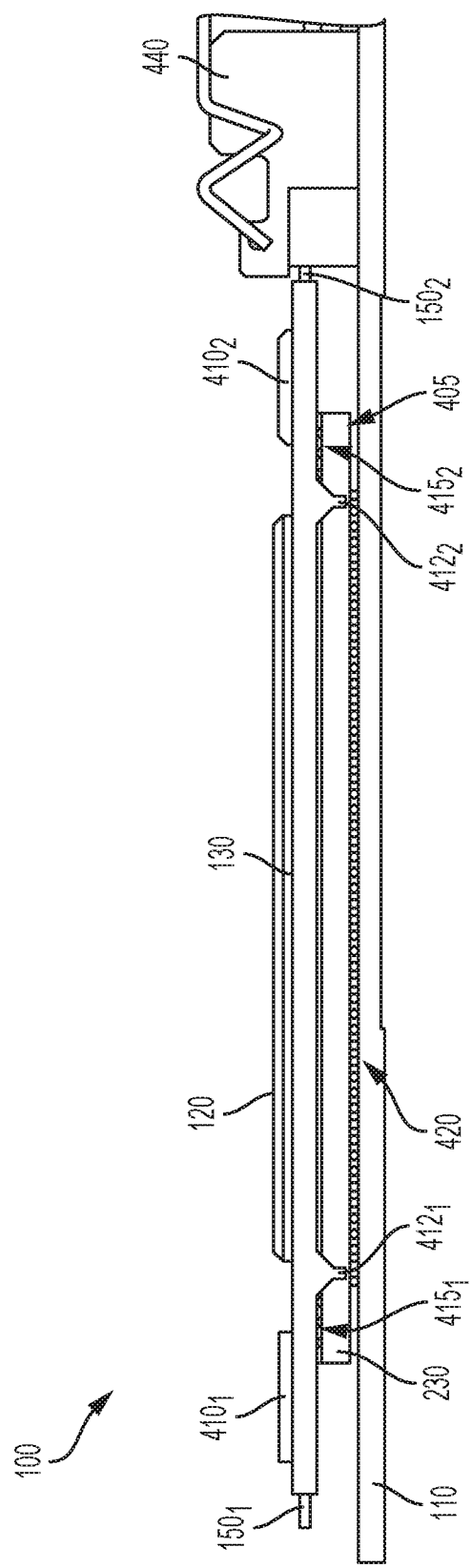
FIG. 4 presents a schematic side-view of a configurable semiconductor package in accordance with one or more embodiments of the disclosure.

FIG. 4 presents a schematic side-view of the semiconductor package 100 illustrated in FIG. 1. The semiconductor package 100 can include the package substrate 230 that includes the first substrate layer 235 and a second substrate layer 405 opposite to the first substrate layer 235. As mentioned, the semiconductor package 100 can include a BGA 420 that permits or otherwise facilitates coupling the semiconductor die 120 to a board surface of the product board 110. The BGA 420 can span a portion of an outermost surface of the substrate layer 405. In one example side-view, a semiconductor die $410_1$ and a semiconductor die $410_2$ can embody, respectively, the semiconductor die 145a and the semiconductor die 155a. In addition, a connection 440 can embody the connection $160_1$. In another example side-view, the semiconductor die $410_1$ and the semiconductor die $410_2$ can embody, respectively, the semiconductor die 145d and the semiconductor die 155b. As disclosed herein, and as illustrated in FIG. 4, the frame 130 can include a first alignment member $412_1$ and a second alignment member $412_2$. Each of the first alignment member $412_1$ and the alignment member $412_2$ can slideably engage or otherwise fit a respective indentations on side surfaces of the package substrate 230. In one example side-view, the first alignment member $412_1$ and the second alignment member $410_2$ can embody, respectively, the alignment member $215_1$ and the alignment member $215_3$. In another example side-view, the first alignment member $412_1$ and the second alignment member $412_2$ can embody, respectively, the alignment member $215_2$ and the alignment member $215_4$. In addition, the connector 440 can embody the connector $160_2$. As mentioned, an expansion package in accordance with one or more embodiments of the disclosure can include an array of interconnects that can permit or otherwise facilitate coupling (mechanically and/or electrically) the expansion package to the package substrate. Specifically, as illustrated in FIG. 4, each of the semiconductor substrate $150_1$ and the semiconductor substrate $150_2$ can include, respectively, a BGA $415_1$ and a BGA $415_2$.

Figure 5:
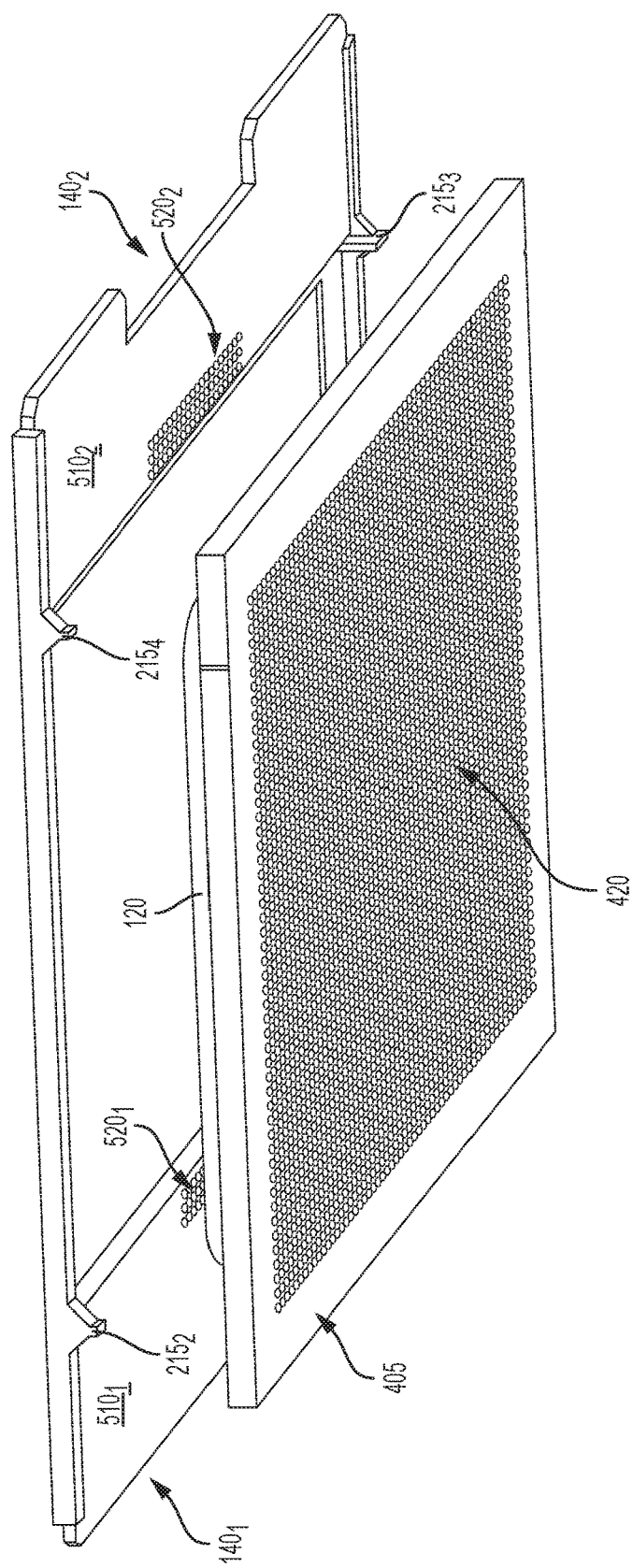
FIG. 5 presents a schematic perspective bottom-view of a deconstructed configurable semiconductor package in accordance with one or more embodiments of the disclosure.

FIG. 5 illustrates a schematic perspective view of the substrate layer 405 and the BGA 420. The BGA 420 is illustrated as spanning a square area, where solder balls in the BGA 420 can be arranged in a finite square point lattice. The disclosure is not so limited, however, and in some embodiments, other areas having different geometries and/or other finite point lattices (e.g., a finite hexagonal point lattice) are contemplated. FIG. 5 also illustrates a surface $510_1$ of the expansion package $140_1$, where the surface $510_1$ is opposite to another surface coupled to the semiconductor die (e.g., semiconductor die 145a, semiconductor die 145b, semiconductor die 145c, or semiconductor die 145d) mounted on the expansion package $140_1$. As disclosed herein, the surface $510_1$ can include a group of interconnects $520_1$ which can permit or otherwise facilitate coupling the expansion package $140_1$ to a first array of interconnects (e.g., conductive pads) of the package substrate 230. The group of interconnects $520_1$ can embody or can constitute, in one example, the BGA $415_1$ shown in FIG. 4. In addition, the expansion package $140_2$ can include a surface $520_2$ opposite to another surface coupled to a semiconductor die of the expansion package $140_2$. The surface $510_2$ can include a group of interconnects $520_2$ that can permit or otherwise facilitate coupling the expansion package $140_2$ to a second array of interconnects (e.g., conductive pads) of the package substrate 230. The group of interconnects $520_2$ can embody or can constitute, in one example, the BGA $415_2$ shown in FIG. 4. As illustrated in FIG. 5, the package substrate 230 includes indentations positioned on side surfaces of the semiconductor package (see also FIG. 2 and FIG. 8) in order to receive respective alignment members, such as alignment member $215_2$ and alignment member $215_4$.

Figure 6:
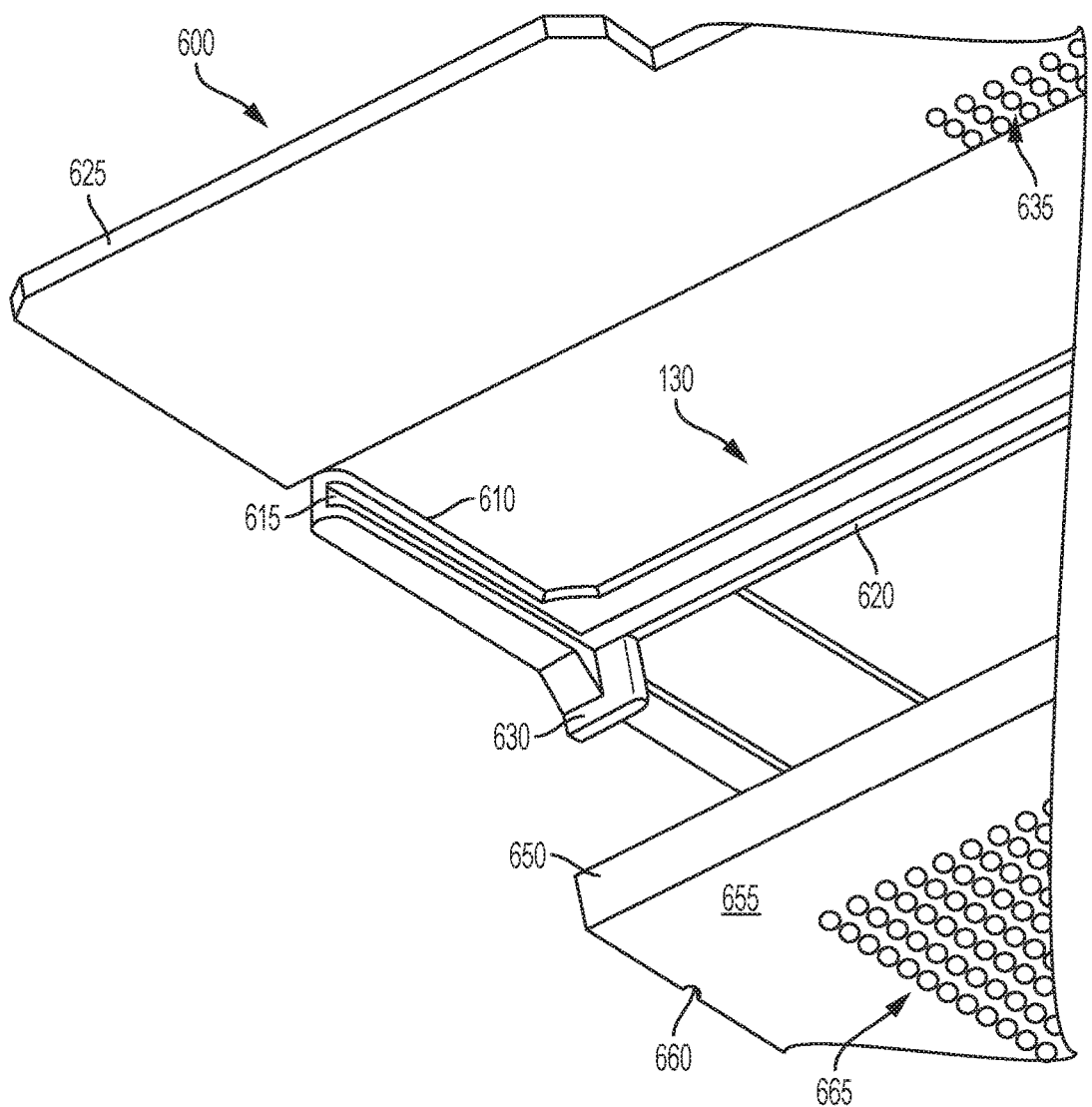
FIG. 6 presents a schematic perspective bottom-view of a deconstructed portion of a semiconductor package in accordance with one or more embodiments of the disclosure.
Figure 7:
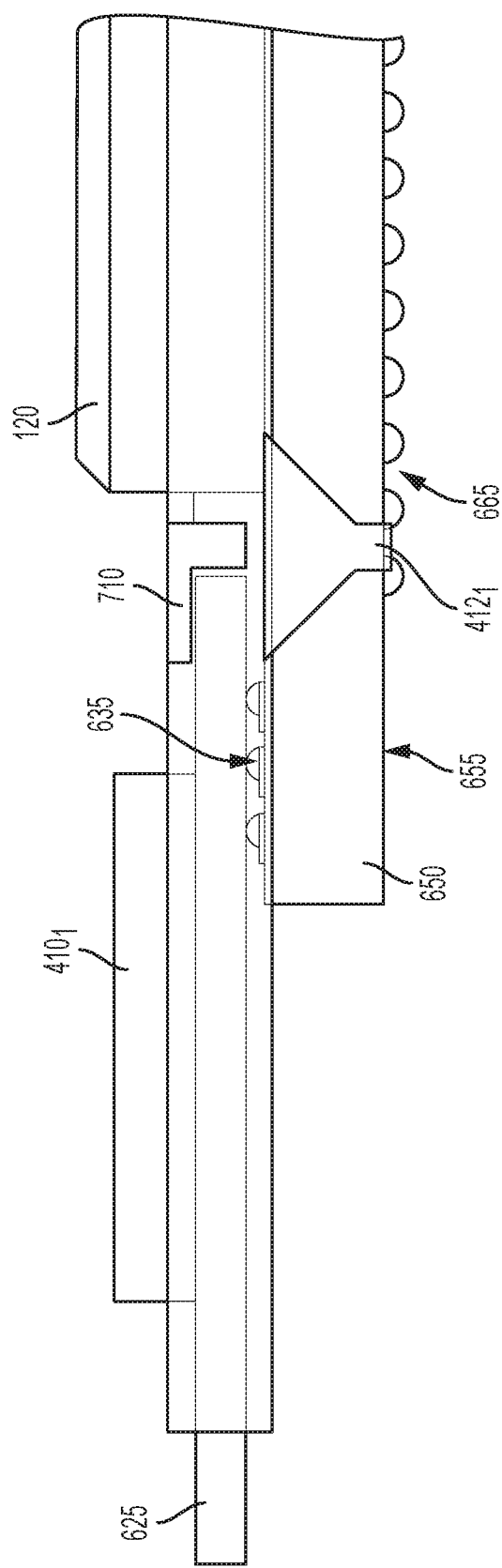
FIG. 7 presents a schematic side-view of a configurable semiconductor package including an expansion package, in accordance with one or more embodiments of the disclosure.

FIG. 6 illustrates a schematic perspective bottom-view of a deconstructed portion of a semiconductor package in accordance with one or more embodiments of the disclosure. As mentioned, the mounting member 130 can include a coupling member 610 including a channel. The coupling member 610 can be coupled to a portion of a sidewall of an edge 620 of the mounting member 130 and to an alignment member 630 (e.g., a protrusion, a slab, or the like). In one example, the channel can be U-shaped cross-sectional area, including a sidewall, and a top wall and bottom wall. In addition, each of the top wall and the bottom wall can form respective right angles with the sidewall. The channel can slideably receive a portion of a substrate 625 of an expansion package 620 to assemble, at least in part, the expansion package 620 to the frame 130. As illustrated in FIG. 7, after assembly, the portion of the substrate 625 can abut or otherwise be in contact with the portion of the sidewall and can rest on the bottom wall of the channel. As is shown in FIG. 7, the block 710 represents a portion the sidewall of the edge 620 and a portion of the top wall of the channel 615.

With further reference to FIG. 6, as illustrated, a package substrate 650 can have an indentation 660 (which also may be referred to as a keying notch) that extends along a longitudinal axis from a first substrate surface 655 of the package substrate 650 to a second substrate surface of the package substrate 650, the second substrate surface opposite to the first substrate surface 655. The indentation 660 can slideably receive a portion of the alignment member 630, as is illustrated in FIG. 7. While not depicted in FIG. 6, the frame 130 can include other alignment members similar to the alignment member 630. In one example, three other alignment members besides the alignment member 630 can be included in the frame 130. Regardless of the specific number of alignment members, the package substrate 650 can include a respective number of indentations (or keying notches), each of the indentations configured to receive a respective one of the alignment members. Therefore, in one aspect, the frame 130 can be positioned to fit the package substrate 650.

Figure 8:
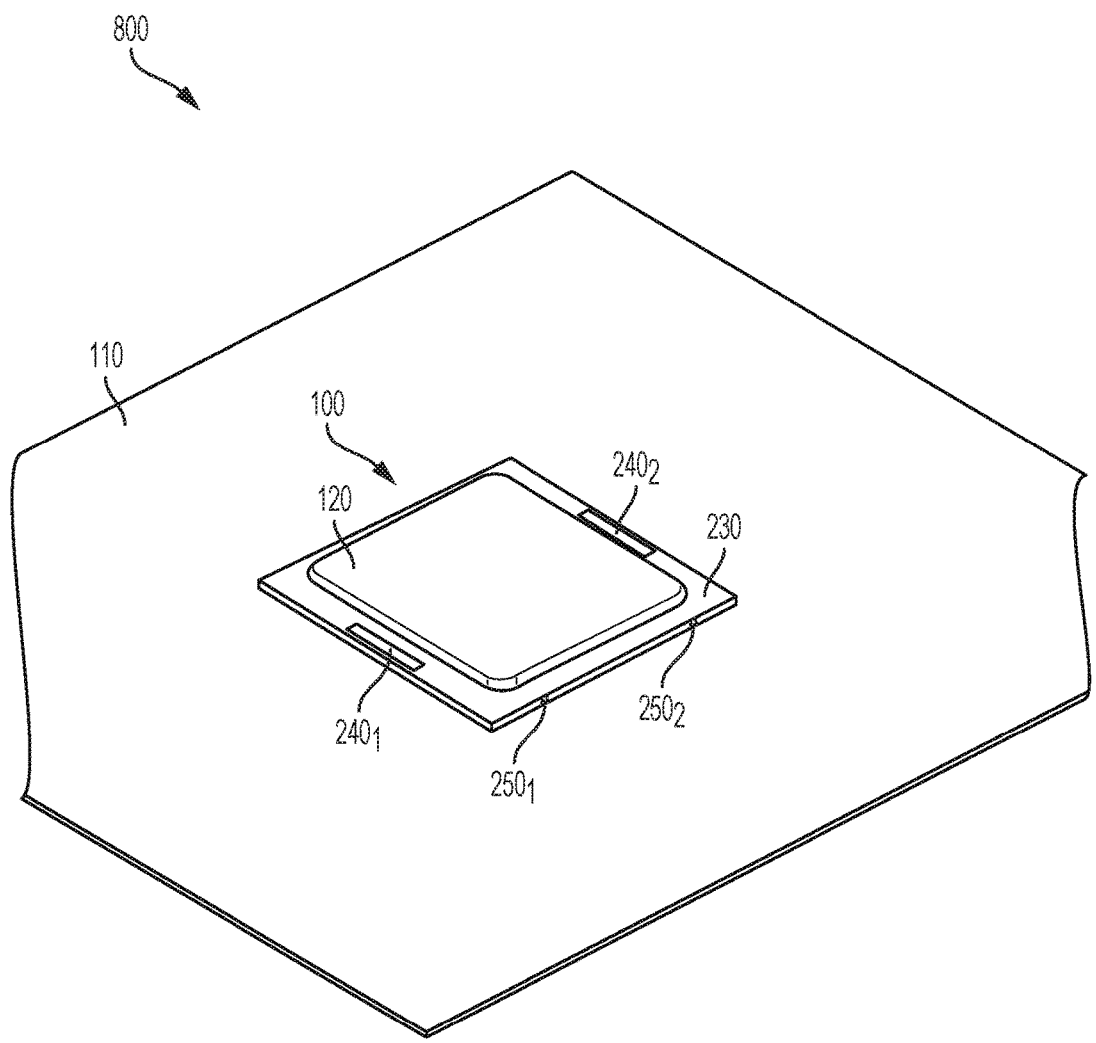
FIG. 8 presents a schematic perspective top-view of an example of a configuration of a configurable semiconductor package in accordance with one or more embodiments of the disclosure.
Figure 9A:
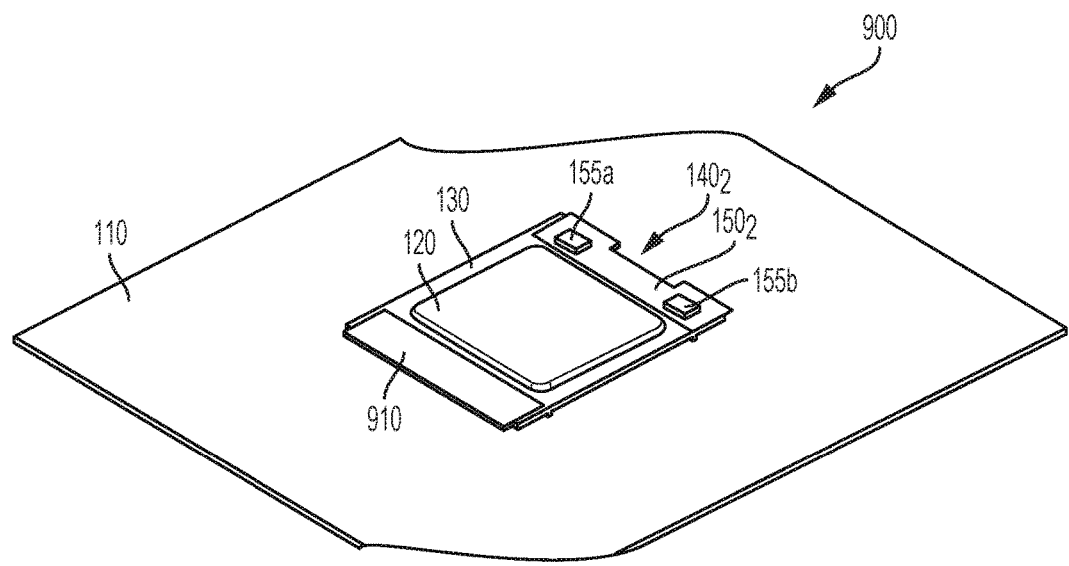
FIG. 9A presents a schematic perspective top-view of an example of another configuration of a configurable semiconductor package in accordance with one or more embodiments of the disclosure.
Figure 9B:
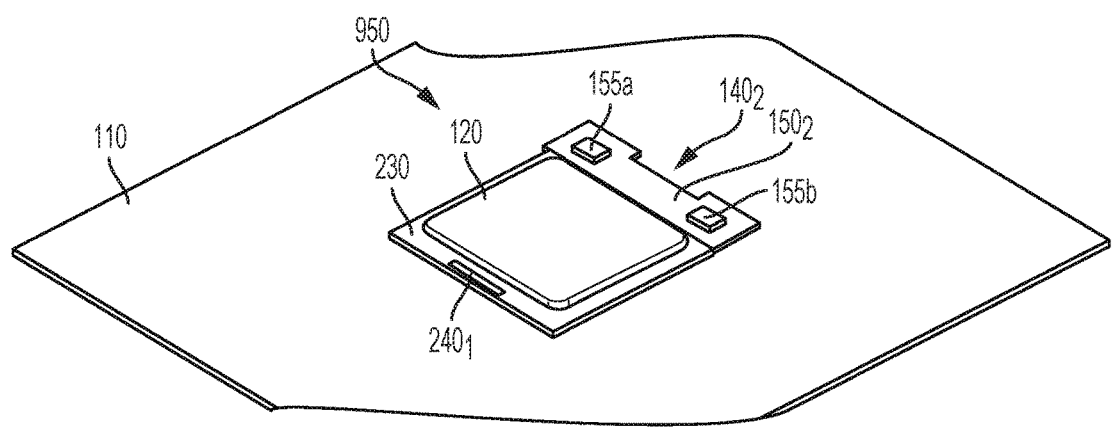
FIG. 9B presents a schematic perspective top-view of an example of yet another configuration of a configurable semiconductor package in accordance with one or more embodiments of the disclosure.

FIG. 8 presents an example of a basic configuration 800 of a configurable semiconductor package 100 in accordance with one or more embodiments of the disclosure. The configuration can correspond to a base feature set providing basic functionality, including defined functionality provided by the semiconductor die 120. FIG. 9A presents an example of one-attachment configuration 900 of the configurable semiconductor package 800 in accordance with one or more embodiments of the disclosure. In some aspects, the configuration 900 can correspond to an assembly utilized during the surface mounting of an expansion package $140_2$ to the basic configuration 800 illustrated in FIG. 8. In some embodiments, the surface mounting of the expansion package $140_2$ can include subjecting the assembly to a heat treatment, such as a reflow process. As such, in some aspects, the one-attachment configuration 900 can include a featureless substrate 910, without any functionality, mounted or otherwise mechanically attached to the mounting frame 130 in order to permit or otherwise mechanically balance the expansion package $140_2$ during surface mounting—e.g., reflow of a BGA included in the expansion package $140_2$. FIG. 9B presents the one-attachment configuration 900 of the configurable semiconductor package 100 after the expansion package $140_2$ has been surface mounted to a portion of the package substrate 230, resulting in configurable semiconductor package 950. The substrate 910 and the mounting member 130 are removed from the one-attachment configuration shown in FIG. 9A. In some embodiments, the mounting member 130 can be removed by selectively etching the mounting member 130 from the configurable semiconductor package 950. In other embodiments, the mounting member 130 can be removed mechanically, utilizing or otherwise leveraging pick-and-place equipment and/or techniques.

Figure 10:
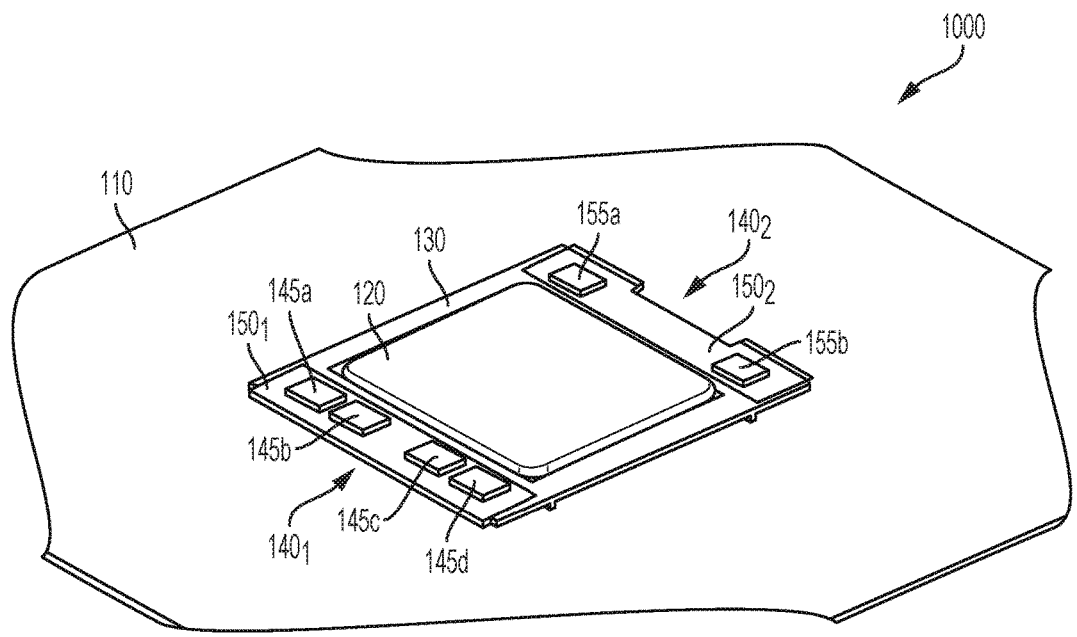
FIG. 10 presents a schematic perspective top-view of an example of still another configuration of a configurable semiconductor package in accordance with one or more embodiments of the disclosure.
Figure 11:
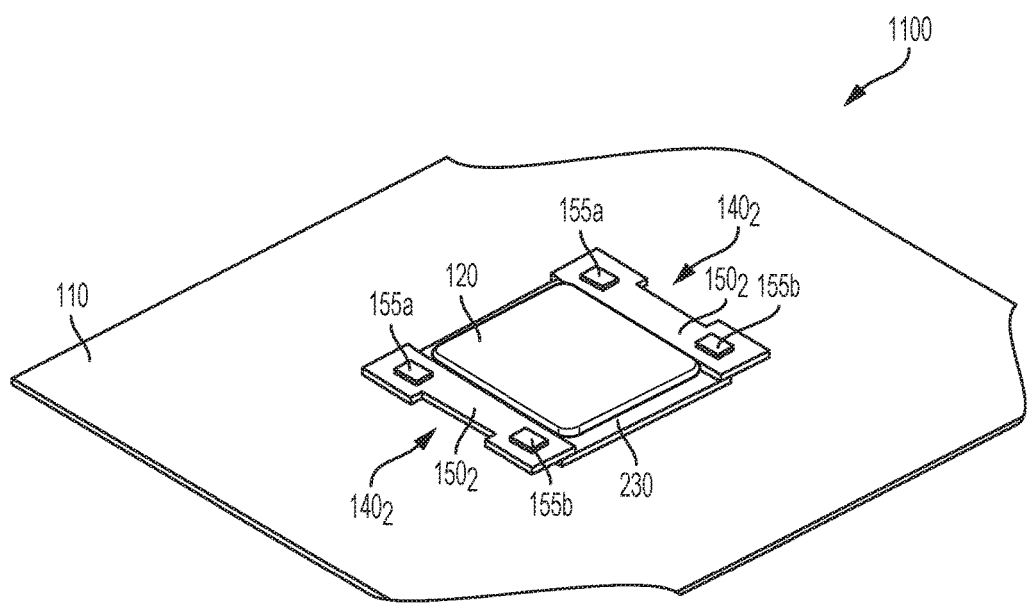
FIG. 11 presents a schematic perspective top-view of an example of a further configuration of a configurable semiconductor package in accordance with one or more embodiments of the disclosure.

FIGS. 10-11 present schematic perspective top-views of respective examples of configurations 1000 and 1100, respectively, of a configurable semiconductor package in accordance with one or more embodiments of the disclosure. Each of configurations 1000 and 1100 is a two-attachment configuration that includes a first expansion package and a second expansion package. In the configuration 1000 shown in FIG. 10, the extension package $140_1$ and the extension package $140_2$ are added to the basic configuration 800 shown in FIG. 8. Instead, in the configuration 1100 shown in FIG. 11, two instances of the extension package $140_2$ are added to the base configuration. As mentioned, the expansion package $140_1$ includes semiconductor dies that provide storage devices, and the expansion package $140_2$ includes other semiconductor dies that provide processing devices. Therefore, the configuration 1000 shown in FIG. 10 can expand or otherwise provide memory and processing capabilities of the basic configuration 800 shown in FIG. 8, and the configuration 1100 shown in FIG. 11 can expand or otherwise provide storage capability of the basic configuration 800.

As mentioned, the incorporation of an expansion package to a base semiconductor package in accordance with one or more embodiments of the disclosure can mitigate or otherwise avoid the addition of solder joints or contacts between the base semiconductor package and a product board (e.g., a motherboard). As such, reliance upon or utilization of expansion packages in accordance with one or more embodiments of the disclosure can permit avoiding utilizing large substrate sizes for a package substrate (e.g., package substrate 230). In addition, by configuring an intended set of functional features by adding one or more expansion packages as described herein, embodiments of the disclosure can reduce unnecessary utilization of real estate available at the product board.

Further, the incorporation of an expansion package to a base semiconductor package in accordance with one or more embodiments of the disclosure also can permit managing SKUs in a streamlined fashion, where capabilities can be enabled in the field and/or after sales on a "pay as you go" model that can permit or otherwise facilitate streamlining of SKUs, and then enabling of features in response to a package upgrade to a package having an additional feature set. This is particularly desirable element as feature mix increases and the number of SKUs proliferates. In addition, embodiments of the disclosure can permit or otherwise facilitate the customization of SKUs to a user at the user's facility during SMT.

In view of the aspects described herein, numerous other processes can be implemented for providing a semiconductor package in accordance with one or more embodiments of this disclosure. Examples of such processes can be better appreciated with reference to the flowchart in FIG. 12. Each block in the illustrated flowchart can represent a process stage or process operation (e.g., etching or removal of an amount of a material, coating of a structure with another amount of another material, epitaxial growth of carrier-doped layer, and the like). Although a particular order of the blocks within an illustrated flowchart is provided, such an ordering is not limiting and the order of two or more of the blocks can be altered without affecting the outcome of the process. For the sake of clarity, well-known elements or aspects of a block in the illustrated flowcharts may not be described in full detail. As with any other processes described herein, in some embodiments, the example method 1200 illustrated in FIG. 12 can be implemented in conjunction with other processes.

Figure 12:
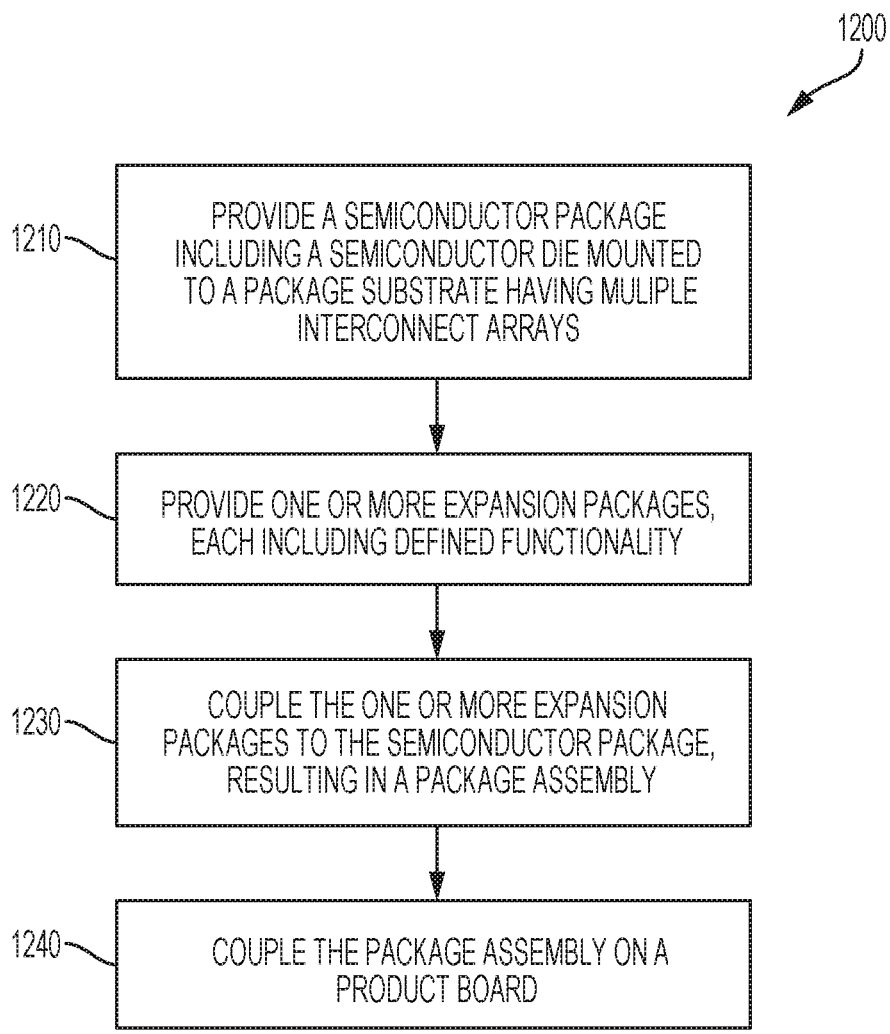
FIG. 12 presents an example of a method in accordance with one or more embodiments of the disclosure.

FIG. 12 presents a flowchart of a process 1200 for configuring a configurable semiconductor package, according to one or more embodiments of the disclosure. At block 1210, a semiconductor package can be provided. In some aspects, the semiconductor package can include a package substrate having a first substrate layer and a second substrate layer opposite to the first layer. The semiconductor package also can include a first semiconductor die mounted on the first substrate layer, where the semiconductor package can provide a first defined functionality. At block 1220, one or more expansion packages can be provided. In some embodiments, each of the expansion package(s) can include a second semiconductor die providing a second defined functionality (computing functionality, information storage functionality, and the like). In other embodiments, a first subset of the expansion package(s) can include a first type of semiconductor die that provides a first type of functionality (e.g., information storage functionality) and a second subset of the expansion package(s) can include a second type of semiconductor die that provides a second type of functionality (e.g., computing functionality, navigation functionality, and the like).

At block 1230, the one or more expansion packages can be coupled to the semiconductor package, resulting in a package assembly. As mentioned, in one embodiment, coupling the expansion package(s) can include, for example, mechanically attaching the expansion package(s) to the semiconductor package by movably mounting an expansion package of the expansion package(s) to a mounting member. In some aspects, the mounting member can include a frame configured (e.g., shaped or otherwise formed) to fit the semiconductor package, and also can include coupling members (e.g., cantilevers or rails), where a first coupling member and a second coupling member can support (individually or collectively) an expansion package of the expansion package(s). As such, the mounting member can have mounted or otherwise coupled thereon the expansion package(s).

At block 1240, the package assembly can be coupled to a product board. In some embodiments, coupling the package assembly to the product board can include mechanically positioning or otherwise arranging the package assembly at a defined location on the product board (a motherboard, a printed circuit board (PCB), or the like). To that end, in one example, pick-and-place equipment and/or techniques can be utilized for such positioning of the package assembly. In addition, coupling the package assembly to the product board can include subjecting the package assembly positioned on the product board to a heat treatment (such as a reflow process). As disclosed herein, the one or more expansion packages movably mounted to the mounting member can include a group of interconnects including a first BGA. Thus, subjecting the package assembly to the heat treatment (e.g., the reflow process) can cause first solder balls in the first BGA to couple or otherwise bond the expansion package(s) to the semiconductor package. Further, the package substrate of the semiconductor package provided at block 1210 also can include a group of interconnects including a second BGA. Therefore, subjecting the package assembly to the heat treatment can cause second solder balls in the second BGA to couple or otherwise bond the package assembly to the product board.

Figure 13:
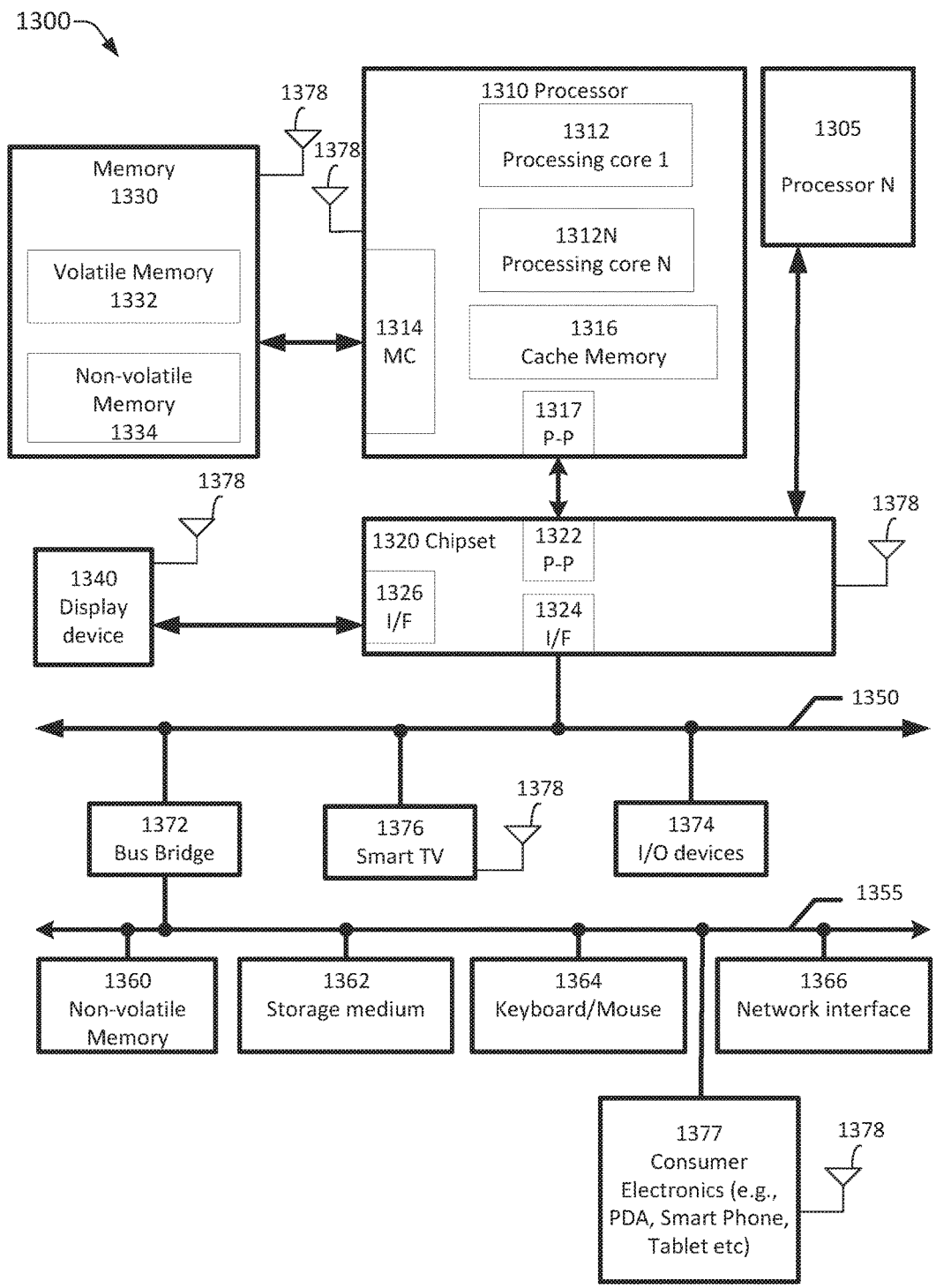
FIG. 13 illustrates an example of a system that can utilize configurable semiconductor package(s) in accordance with one or more embodiments of the disclosure.

FIG. 13 depicts an example of a system 1300 according to one or more embodiments of the disclosure. In one embodiment, system 1300 includes a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1300 can include a system on a chip (SOC) system or a system-in-package (SiP).

In one embodiment, system 1300 includes multiple processors including processor 1310 and processor N 1305, where processor 1305 has logic similar or identical to the logic of processor 1310. In one embodiment, processor 1310 has one or more processing cores (represented here by processing core 1312 and processing core 1312N, where 1312N represents the Nth processor core inside processor 1310, where N is a positive integer). More processing cores can be present (but not depicted in the diagram of FIG. 13). In some embodiments, processing core 1312 includes prefetch logic to fetch instructions, decode logic to decode the instructions, execution logic to execute instructions, a combination thereof, or the like. In some embodiments, processor 1310 has a cache memory 1316 to cache instructions and/or data for system 1300. Cache memory 1316 may be organized into a hierarchical structure including one or more levels of cache memory.

In some embodiments, processor 1310 includes a memory controller (MC) 1314, which is configured to perform functions that enable the processor 1310 to access and communicate with memory 1330 that includes a volatile memory 1332 and/or a non-volatile memory 1334. In some embodiments, processor 1310 can be coupled with memory 1330 and chipset 1320. Processor 1310 may also be coupled to a wireless antenna 1378 to communicate with any device configured to transmit and/or receive wireless signals. In one embodiment, the wireless antenna interface 1378 operates at least in accordance with the IEEE 802.11 standard and its related family, Home Plug AV (HPAV), Ultra Wide Band (UWB), Bluetooth, WiMax, or any form of wireless communication protocol.

In some embodiments, volatile memory 1332 includes Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1334 includes flash memory, phase change memory (PCM), read-only memory (ROM), electrically erasable programmable read-only memory (EEPROM), or any other type of non-volatile memory device.

Memory device 1330 stores information and instructions to be executed by processor 1310. In one embodiment, memory 1330 may also store temporary variables or other intermediate information while processor 1310 is executing instructions. In the illustrated embodiment, chipset 1320 connects with processor 1310 via Point-to-Point (PtP or P-P) interface 1317 and P-P interface 1322. Chipset 1320 enables processor 1310 to connect to other elements in system 1300. In some embodiments of the disclosure, P-P interface 1317 and P-P interface 1322 can operate in accordance with a PtP communication protocol, such as the Intel® QuickPath Interconnect (QPI) or the like. In other embodiments, a different interconnect may be used.

In some embodiments, chipset 1320 can be configured to communicate with processor 1310, 1305N, display device 1340, and other devices 1372, 1376, 1374, 1360, 1362, 1364, 1366, 1377, etc. Chipset 1320 may also be coupled to the wireless antenna 1378 to communicate with any device configured to transmit and/or receive wireless signals.

Chipset 1320 connects to display device 1340 via interface 1326. Display 1340 may be, for example, a liquid crystal display (LCD), a plasma display, cathode ray tube (CRT) display, or any other form of visual display device. In some embodiments of the disclosure, processor 1310 and chipset 1320 are integrated into a single SOC. In addition, chipset 1320 connects to bus 1350 and/or bus 1355 that interconnect various elements 1374, 1360, 1362, 1364, and 1366. Bus 1350 and bus 1355 may be interconnected via a bus bridge 1372. In one embodiment, chipset 1320 couples with a non-volatile memory 1360, a mass storage device(s) 1362, a keyboard/mouse 1364, and a network interface 1366 via interface 1324 and/or 1304, smart TV 1376, consumer electronics 1377, etc.

In one embodiment, mass storage device(s) 1362 can include a solid state drive, a hard disk drive, a universal serial bus flash memory drive, or any other form of computer data storage medium. In one embodiment, network interface 1366 is implemented by any type of well-known network interface standard including an Ethernet interface, a universal serial bus (USB) interface, a Peripheral Component Interconnect (PCI) Express interface, a wireless interface and/or any other suitable type of interface. In one embodiment, the wireless interface operates in accordance with the IEEE 802.11 standard and its related family, Home Plug AV (HPAV), Ultra Wide Band (UWB), Bluetooth, WiMax, or any form of wireless communication protocol.

While the modules shown in FIG. 13 are depicted as separate blocks within the system 900, the functions performed by some of these blocks may be integrated within a single semiconductor circuit or may be implemented using two or more separate integrated circuits. For example, although cache memory 1316 is depicted as a separate block within processor 1310, cache memory 1316 or selected elements thereof can be incorporated into processor core 1312.

It is noted that the system 1300 described herein may be any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages (for example, the configurable semiconductor packages described in connection with any of FIGS. 1-11), as disclosed herein, may be provided in any variety of electronic device including consumer, industrial, military, communications, infrastructural, and/or other electronic devices.

The semiconductor package, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the semiconductor package, as described herein, may be used to house one or more memory chips. The memory may include one or more volatile and/or non-volatile memory devices including magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAMBUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the semiconductor package is provided may be a computing device. Such a computing device may house one or more boards on which the semiconductor package connections may be disposed. The board may include a number of components including a processor and/or at least one communication chip. The processor may be physically and electrically connected to the board through, for example, electrical connections of the semiconductor package. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

FURTHER EXAMPLES

The following examples pertain to further or alternative embodiments of this disclosure. Example 1 is a semiconductor package, comprising: a package substrate having a first substrate layer and a second substrate layer opposite to the first substrate layer; a first semiconductor die mounted to the first substrate layer; and a mounting member to receive a plurality of expansion packages, each of the plurality of expansion packages including a substrate and one or more semiconductor dies mounted to the substrate, wherein the mounting member rests on a portion of the first substrate layer. In example 2, the package of example 1 can optionally include the mounting member comprising one of a metal, a metal alloy, a plastic material, or a composite material. In example 3, the package of any one of examples 1-2 can optionally include the mounting member comprising a frame including a plurality of recesses including a plurality of respective sidewalls, a first recess including a first sidewall extending from a first end of an edge of the frame to a distal second end of the edge, the first recess further including a second sidewall extending from the first end to the distal second end. In example 4, the package of any one of examples 1-3 can optionally include a first cross-sectional area of the frame defined by the plurality of respective sidewalls fits a second cross-sectional area of the first semiconductor die. In example 5, the package of examples 1-4 can optionally include the mounting member comprising a plurality of alignment members adjacent to respective ones of a plurality of vertices of the frame, each of the plurality of alignment members on the first substrate layer is slideably receivable in a respective one of a plurality of indentations in the package substrate. In example 6, the package of any one of examples 1-5 can optionally include each of the plurality of indentations being positioned in an edge of the package substrate and extends from the first substrate layer to the second substrate layer, a first indentation of the plurality of indentations being adjacent to a second indentation of the plurality of indentations and being opposite to a third indentation of the plurality of indentations. In example 7, the package of any one of examples 1-6 can optionally include the mounting member comprising a plurality of coupling members coupled to the frame, each of the coupling members coupled to an end of an edge of the frame and further coupled to a surface of an alignment member of the plurality of alignment members. In example 8, the package of any one of claims 1-7 can optionally include the plurality of coupling members comprising a first coupling member and a second coupling member, and the first coupling member being coupled to a first end of a first edge of the frame and further coupled to a surface of a first alignment member of the plurality of alignment members, and the second coupling member being coupled to a first edge of a second edge of the frame and further coupled to a surface of the first alignment member, the first edge substantially parallel to the second edge. In example 9, the package of any one of claims 1-8 can optionally include the first coupling member comprising a first channel and the second coupling member comprising a second channel, and a first portion of the substrate being slideably engaged in the first channel and a second portion of the substrate being slideably engaged in the second channel. In example 10, the package of any one of examples 1-9 can optionally include an edge of the substrate abutting a sidewall of a recess of a third edge perpendicular to the first edge and the second edge. In example 11, the examples of any one of examples 1-10 can optionally include the first substrate layer comprising a first plurality of interconnects positioned adjacent to the first semiconductor die, and the substrate comprising a second plurality of interconnects to couple with at least a portion of the first plurality of interconnects. In example 12, the package of any one of examples 1-11 can optionally include the plurality of interconnects spanning a rectangular area having a first side length having a magnitude in a first range from about of about 1 mm to about 100 mm, the rectangular area further having a second side length having a second magnitude in a second range from about 1 mm to about 5 mm. In example 13, the package of any one of examples 1-12 can optionally include the plurality of interconnects comprising a plurality of conductive pads in a defined layout. In example 14, the package of any one of examples 1-13 can optionally include the defined layout comprising a portion of a hexagonal point lattice having a defined pitch in a range from about 1 μm to about 1000 μm.

Further, Example 15 is a method for configurable semiconductor packages, comprising: providing a semiconductor package comprising a semiconductor die mounted to a package substrate having a plurality of interconnect arrays, the semiconductor package assembled to provide a first functionality; providing one or more expansion packages, each of the one or more expansions packages assemble to provide respective one or more second functionalities; coupling the one or more expansion packages to the semiconductor package via respective one or more of the plurality of interconnect arrays, resulting in a package assembly; coupling the package assembly to a product board via a second one of the plurality of interconnect arrays. In example 16, the method of example 15 can optionally include coupling the one or more packages to the semiconductor package comprising providing a mounting member comprising a frame that fits the semiconductor package and further comprising a plurality of coupling members; and movably attaching the one or more expansion packages to at least a portion of the plurality of coupling members. In example 17, the method of any one of examples 15-16 can optionally include providing the one or more expansion packages comprising providing respective one or more package substrates, each of the one or more package substrates comprising an array of interconnects. In example 18, the method of any one of examples 15-17 can optionally include coupling the one or more packages to the semiconductor package further comprising applying a defined heat treatment to the array of interconnects. In example 19, the method of any one of examples 15-18 can optionally include providing the semiconductor package comprising providing a package substrate including a first substantially planar surface and a second substantially planar surface opposite to the first substantially planar surface, the package substrate further including a plurality of first interconnect arrays disposed on the first substantially planar surface and a second interconnect array disposed on the second substantially planar surface. In example 20, the method of any one of examples 15-19 can optionally include coupling the package assembly to the product board comprising applying the defined heat treatment to the second interconnect array.

Further, Example 21 is an electronic device, comprising: a first semiconductor die comprising first circuitry to provide first functionality, the first semiconductor die surface mounted to a first substrate layer of a first package substrate, wherein the first substrate layer includes an array of conductive pads; a second semiconductor die comprising second circuitry to provide second functionality, the second semiconductor die surface mounted to a first substrate surface of a second package substrate; the second package substrate comprising a second substrate surface opposite to the first substrate surface of the second package substrate, the second substrate surface including a plurality of interconnects; and the plurality of interconnects coupled to at least a portion of the array of conductive pads. In example 22, the device of example 21 can optionally include the first substrate layer comprising a second array of conductive pads, further comprising, a third semiconductor die comprising third circuitry to provide third functionality, the third semiconductor die surface mounted to a first substrate surface of a third package substrate; the third package substrate comprising a second substrate surface opposite to the first substrate surface of the third package substrate, the second substrate surface of the third package substrate including a plurality of interconnects; and the plurality of interconnects of the second substrate surface coupled to at least a portion of the second array of conductive pads. In example 23, the device of any one of examples 21-22 can optionally include the first package substrate comprising a plurality of interconnects positioned at a second substrate layer of the first package substrate, the second substrate layer opposite the first substrate layer of the first package substrate, the plurality of interconnects to couple the first package substrate to product board. In example 24, the device of any one of examples 21-23 can optionally include each of the array of conductive pads and the second array of conductive pads having a defined layout. In example 25, the device of any one of examples 21-24 can optionally include the defined layout spanning a rectangular area having a first side length having a magnitude in a first range from about of about 1 mm to about 100 mm, the rectangular area further having a second side length having a second magnitude in a second range from about 1 mm to about 5 mm. In example 26, the device of any one of examples 21-25 can optionally include the defined layout comprising a fragment of a periodic point lattice including one of a square point lattice, a triangular point lattice, or a hexagonal point lattice. In example 27, the device of any one of examples 21-26 can optionally include the periodic point lattice has a defined pitch in a range from about 1 μm to about 1000 μm.

Further, Example 28 is an assembly, comprising: means for supporting a first semiconductor die in a semiconductor package; and means for holding at least one expansion package adjacent the first semiconductor die, each of the at least one expansion package including a substrate and one or more semiconductor dies mounted to the substrate, wherein the means for holding includes means for fitting to the means for supporting the first semiconductor die. In example 29, the assembly of example 28 can optionally include the means for supporting comprising a plurality of means for coupling one or more of the at least one expansion package to a package substrate of the semiconductor package. In example 30, the assembly of any one of examples 28-29 can optionally include a first means for coupling of the plurality of means for coupling comprises multiple conductive means for bonding a first expansion package of the at least one expansion package to the package substrate of the semiconductor package. In example 31, the assembly of any one of examples 28-30 can optionally include the multiple conductive means for bonding being disposed on a surface of package substrate according to a defined layout. In example 32, the assembly of any one of examples 28-31 can optionally include the means for attaching comprising a plurality of means for aligning the means for holding with a package substrate of the semiconductor package. In example 33, the assembly of any one of examples 28-32 can optionally include the means for holding comprising a plurality of means for engaging one or more of the at least one expansion package. In example 34, the assembly of any one of examples 28-33 can optionally include each of the means for engaging comprising means for slideably engaging a portion of the substrate.

As mentioned, unless otherwise expressly stated, it is in no way intended that any protocol, procedure, process, or method set forth herein be construed as requiring that its acts or steps be performed in a specific order. Accordingly, where a process or method claim does not actually recite an order to be followed by its acts or steps or it is not otherwise specifically recited in the claims or descriptions of the subject disclosure that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification or annexed drawings, or the like.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein is generally intended to include deposition of material or photoresist, patterning, exposure, development, etching, cleaning, ablating, polishing, and/or removal of the material or photoresist as required in forming a described structure.

What has been described herein in the present specification and annexed drawings includes examples of configurable semiconductor packages and techniques to provide such packages. It is, of course, not possible to describe every conceivable combination of elements and/or methodologies for purposes of describing the various features of the disclosure, but one of ordinary skill in the art can recognize that many further combinations and permutations of the claimed subject matter are possible. Accordingly, it may be apparent that various modifications can be made to the disclosure without departing from the scope or spirit thereof. In addition or in the alternative, other embodiments of the disclosure may be apparent from consideration of the specification and annexed drawings, and practice of the disclosure as presented herein. It is intended that the examples put forward in the specification and annexed drawings be considered, in all respects, as illustrative and not restrictive. Although specific terms are employed herein, they are used in a generic and descriptive sense only and not for purposes of limitation.

What is claimed is:

1. A semiconductor package, comprising:
  a package substrate having a first substrate layer and a second substrate layer opposite to the first substrate layer;
  a first semiconductor die mounted to the first substrate layer; and
  a mounting member to receive a plurality of expansion packages, each of the plurality of expansion packages including a substrate and one or more semiconductor dies mounted to the substrate, wherein the mounting member rests on a portion of the first substrate layer, and wherein the mounting member comprises a plurality of alignment members, each of the plurality of alignment members on the first substrate layer is slideably receivable in a respective one of a plurality of indentations in the package substrate.

2. The semiconductor package of claim 1, wherein the mounting member comprises one of a metal, a metal alloy, a plastic material, or a composite material.

3. The semiconductor package of claim 1, wherein the mounting member comprises a frame including a plurality of recesses including a plurality of respective sidewalls, a first recess including a first sidewall extending from a first end of an edge of the frame to a distal second end of the edge, the first recess further including a second sidewall extending from the first end to the distal second end.

4. The semiconductor package of claim 3, wherein a first cross-sectional area of the frame defined by the plurality of respective sidewalls fits a second cross-sectional area of the first semiconductor die.

5. The semiconductor package of claim 3, wherein each of the plurality of indentations is positioned in an edge of the package substrate and extends from the first substrate layer to the second substrate layer, a first indentation of the plurality of indentations is adjacent to a second indentation of the plurality of indentations and is opposite to a third indentation of the plurality of indentations.

6. The semiconductor package of claim 3, wherein the mounting member comprises a plurality of coupling members coupled to the frame, each of the coupling members coupled to an end of an edge of the frame and further coupled to a surface of an alignment member of the plurality of alignment members.

7. The semiconductor package of claim 6, wherein the plurality of coupling members comprises a first coupling member and a second coupling member, and wherein the first coupling member is coupled to a first end of a first edge of the frame and further coupled to a surface of a first alignment member of the plurality of alignment members, and wherein the second coupling member is coupled to a first edge of a second edge of the frame and further coupled to a surface of the first alignment member, the first edge substantially parallel to the second edge.

8. The semiconductor package of claim 7, wherein the first coupling member comprises a first channel and the second coupling member comprises a second channel, and wherein a first portion of the substrate is slideably engaged in the first channel and a second portion of the substrate is slideably engaged in the second channel.

9. The semiconductor package of claim 8, wherein an edge of the substrate abuts a sidewall of a recess of a third edge perpendicular to the first edge and the second edge.

10. The semiconductor package of claim 1, wherein the first substrate layer comprises a first plurality of interconnects positioned adjacent to the first semiconductor die, and wherein the substrate comprises a second plurality of interconnects to couple with at least a portion of the first plurality of interconnects.

11. The semiconductor package of claim 10, wherein at least one of the first plurality of interconnects and the second plurality of interconnects spans a rectangular area having a first side length having a magnitude in a first range from about of about 1 mm to about 100 mm, the rectangular area further having a second side length having a second magnitude in a second range from about 1 mm to about 5 mm.

12. The semiconductor package of claim 11, wherein the at least one of the first plurality of interconnects and the second plurality of interconnects comprises a plurality of conductive pads in a defined layout.

13. The semiconductor package of claim 12, wherein the defined layout comprises a portion of a hexagonal point lattice having a defined pitch in a range from about 1 µm to about 1000 µm.

14. A method for configurable semiconductor packages, comprising:
providing a semiconductor package comprising a semiconductor die mounted to a package substrate having a plurality of interconnect arrays, the semiconductor package assembled to provide a first functionality;
providing one or more expansion packages, each of the one or more expansions packages assembled to provide respective one or more second functionalities;
providing a mounting member to receive the one or more expansion packages, wherein the mounting member comprises a plurality of alignment members, each of the plurality of alignment members is slideably receivable in a respective one of a plurality of indentations in the package substrate;
coupling the one or more expansion packages to the semiconductor package via respective one or more of the plurality of interconnect arrays, resulting in a package assembly; and
coupling the package assembly to a product board via a second one of the plurality of interconnect arrays.

15. The method of claim 14, wherein the coupling the one or more expansion packages to the semiconductor package comprises providing a mounting member comprising a frame that fits the semiconductor package and further comprising a plurality of coupling members; and
movably attaching the one or more expansion packages to at least a portion of the plurality of coupling members.

16. The method of claim 15, wherein the providing the one or more expansion packages comprises providing respective one or more package substrates, each of the one or more package substrates comprising an array of interconnects.

17. The method of claim 16, wherein the coupling the one or more expansion packages to the semiconductor package further comprises applying a defined heat treatment to the array of interconnects.

18. The method of claim 17, wherein the providing the semiconductor package comprises providing a package substrate including a first substantially planar surface and a second substantially planar surface opposite to the first substantially planar surface, the package substrate further including a plurality of first interconnect arrays disposed on the first substantially planar surface and a second interconnect array disposed on the second substantially planar surface.

19. The method of claim 18, wherein the coupling the package assembly to the product board comprises applying the defined heat treatment to the second interconnect array.

20. The method of claim 19, wherein the second interconnect array comprises a ball grid array, and wherein the applying the defined heat treatment comprises implementing a reflow process.

* * * * *